(12) United States Patent
Oh et al.

(10) Patent No.: US 11,282,819 B2
(45) Date of Patent: Mar. 22, 2022

(54) SEMICONDUCTOR DEVICE HAVING CHIP-TO-CHIP BONDING STRUCTURE

(71) Applicant: SK hynix Inc., Icheon-si (KR)

(72) Inventors: Sung Lae Oh, Cheongju-si (KR); Sang Hyun Sung, Cheongju-si (KR); Kwang Hwi Park, Icheon-si (KR); Je Hyun Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 128 days.

(21) Appl. No.: 16/830,124

(22) Filed: Mar. 25, 2020

(65) Prior Publication Data

US 2021/0098424 A1 Apr. 1, 2021

(30) Foreign Application Priority Data

Sep. 26, 2019 (KR) .................. 10-2019-0118600

(51) Int. Cl.
| | |
|---|---|
| *H01L 25/065* | (2006.01) |
| *H01L 25/18* | (2006.01) |
| *H01L 23/00* | (2006.01) |
| *H01L 21/66* | (2006.01) |
| *G11C 16/30* | (2006.01) |
| *G01R 31/319* | (2006.01) |

(52) U.S. Cl.
CPC .... *H01L 25/0657* (2013.01); *G01R 31/31924* (2013.01); *G11C 16/30* (2013.01); *H01L 22/32* (2013.01); *H01L 24/08* (2013.01); *H01L 25/18* (2013.01); *H01L 2224/08145* (2013.01); *H01L 2225/06524* (2013.01); *H01L 2225/06596* (2013.01); *H01L 2924/1431* (2013.01); *H01L 2924/1434* (2013.01)

(58) Field of Classification Search
CPC ........... H01L 25/18; H01L 2224/08145; H01L 25/0657; H01L 24/08; H01L 2225/06541
See application file for complete search history.

(56) References Cited

U.S. PATENT DOCUMENTS

| | | | | |
|---|---|---|---|---|
| 7,633,829 | B2 * | 12/2009 | Fasoli | G11C 8/10 |
| | | | | 365/230.03 |
| 8,913,443 | B2 * | 12/2014 | Pyeon | G11C 11/4074 |
| | | | | 365/189.09 |
| 9,087,841 | B2 * | 7/2015 | Christiansen | H01L 23/5256 |

(Continued)

FOREIGN PATENT DOCUMENTS

| | | |
|---|---|---|
| KR | 10-2005-0075577 A | 7/2005 |
| KR | 10-2021-0026432 A | 3/2021 |

*Primary Examiner* — Bradley Smith
*Assistant Examiner* — David J Goodwin

(57) ABSTRACT

A semiconductor device includes a first chip, divided into a plurality of regions, including a plurality of first pads and a plurality of first test pads in each of the plurality of regions; and a second chip including a plurality of second pads corresponding to the plurality of first pads and a plurality of second test pads corresponding to the plurality of first test pads, and bonded onto the first chip such that the plurality of second pads are coupled to the plurality of first pads. The second chip includes a voltage generation circuit linked to the plurality of second pads, that provides a compensated voltage to the plurality of second pads for each of the plurality of regions, based on a voltage drop value for each region due to a contact resistance between the plurality of first test pads and the plurality of second test pads.

10 Claims, 17 Drawing Sheets

(56) References Cited

U.S. PATENT DOCUMENTS

| | | | |
|---|---|---|---|
| 9,953,994 B2* | 4/2018 | Or-Bach | G11C 16/0466 |
| 2011/0228586 A1* | 9/2011 | Kawabata | G11C 13/004 |
| | | | 365/148 |
| 2013/0070540 A1* | 3/2013 | Pyeon | G11C 11/4074 |
| | | | 365/189.07 |
| 2020/0058669 A1* | 2/2020 | Chen | H01L 27/11582 |
| 2020/0105721 A1* | 4/2020 | Park | H01L 25/50 |
| 2020/0395341 A1* | 12/2020 | Maejima | H01L 25/0657 |
| 2021/0057427 A1* | 2/2021 | Oh | H01L 27/11582 |
| 2021/0082877 A1* | 3/2021 | Uchiyama | H01L 25/50 |
| 2021/0111137 A1* | 4/2021 | Chen | H01L 23/528 |

* cited by examiner

SEMICONDUCTOR DEVICE HAVING CHIP-TO-CHIP BONDING STRUCTURE

CROSS-REFERENCE TO RELATED APPLICATION

The present application claims priority under 35 U.S.C. § 119(a) to Korean Patent Application No. 10-2019-0118600 filed in the Korean Intellectual Property Office on Sep. 26, 2019, which is incorporated herein by reference in its entirety.

BACKGROUND

1. Technical Field

Various embodiments generally relate to a semiconductor device, and particularly, to a semiconductor device which has a chip-to-chip bonding structure.

2. Related Art

In order to reduce the occupation area, size or footprint of semiconductor devices, methods have been proposed in which elements configuring the semiconductor devices are fabricated on separate chips, rather than being fabricated on a single chip, and are then bonded to each other.

SUMMARY

Various embodiments are directed to a semiconductor device capable of contributing to improvements in reliability.

In an embodiment, a semiconductor device may include: a first chip, divided into a plurality of regions, including a plurality of first pads and a plurality of first test pads in each of the plurality of regions; and a second chip including a plurality of second pads corresponding to the plurality of first pads and a plurality of second test pads corresponding to the plurality of first test pads, and bonded onto the first chip such that the plurality of second pads are coupled to the plurality of first pads. The second chip may include a voltage generation circuit, linked to the plurality of second pads, that provides a compensated voltage to the plurality of second pads for each of the plurality of regions, based on a voltage drop value for each region due to a contact resistance between the plurality of first test pads and the plurality of second test pads.

In an embodiment, a semiconductor device may include: a memory chip divided into a plurality of regions disposed in a first direction, each of the plurality of regions including a plurality of bit lines which extend in a second direction intersecting with the first direction and are coupled to a plurality of memory cells, a plurality of first pads which are coupled to the plurality of bit lines, and a plurality of first test pads coupled to each other through a wiring line extending in the second direction; and a circuit chip including a plurality of second pads corresponding to the plurality of first pads and a plurality of second test pads corresponding to the plurality of first test pads, and bonded onto the memory chip such that the plurality of second pads are coupled to the plurality of first pads. The circuit chip may include a voltage generation circuit linked to the plurality of second pads and provides a compensated bit line voltage to the plurality of second pads for each of the plurality of regions, based on a voltage drop value for each region due to a contact resistance between the plurality of first test pads and the plurality of second test pads.

In an embodiment, a semiconductor device may include: a memory chip divided into a plurality of regions disposed in a second direction intersecting with a first direction, and including, in each of the plurality of regions, a plurality of row lines which extend in the first direction and are coupled to a plurality of memory cells, a plurality of first pads which are coupled to the plurality of row lines, and a plurality of first test pads coupled to each other through a wiring line extending in the first direction; and a circuit chip including a plurality of second pads corresponding to the plurality of first pads and a plurality of second test pads corresponding to the plurality of first test pads, and bonded onto the memory chip such that the plurality of second pads are coupled to the plurality of first pads. The circuit chip may include a voltage generation circuit linked to the plurality of second pads and provides a compensated row line voltage to the plurality of second pads for each region, based on a voltage drop value for each region due to a contact resistance between the plurality of first test pads and the plurality of second test pads.

DETAILED DESCRIPTION

Figure 1:
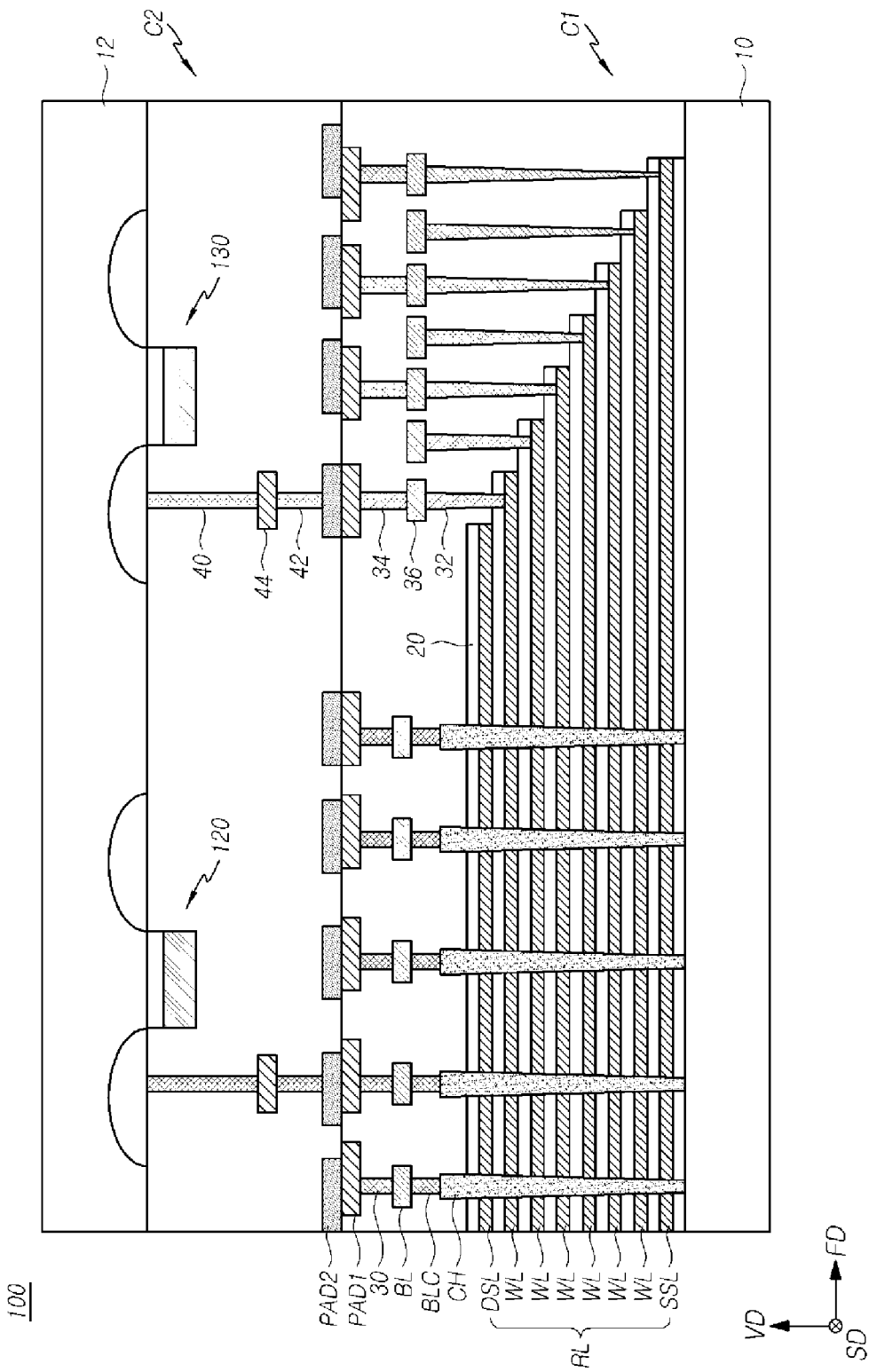
FIG. 1 is a cross-sectional view illustrating an example of a semiconductor device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the") the article may include a plural of that noun unless specifically stated otherwise.

Elements in embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings. In the accompanying drawings, two directions that are substantially parallel to the top surface of a substrate and intersect with each other are defined as a first direction FD and a second direction SD, respectively, and a direction that vertically protrudes from the top surface of the substrate is defined as a vertical direction VD. The first direction FD and second direction SD may substantially perpendicularly intersect with each other to form a plane substantially parallel to the top surface of the substrate. The vertical direction VD may correspond to a direction that is perpendicular to the first direction FD and the second direction SD. In the drawings, a direction indicated by an arrow and a direction opposite thereto represent the same direction.

FIG. 1 is a cross-sectional view illustrating an example of a semiconductor device in accordance with an embodiment of the disclosure.

Referring to FIG. 1, a semiconductor device 100 in accordance with an embodiment of the disclosure may include a first chip C1 and a second chip C2 which are bonded to each other. A plurality of memory cells may be defined in the first chip C1, and logic circuits for controlling the operations of the memory cells may be defined in the second chip C2. The first chip C1 may correspond to a memory chip, and the second chip C2 may correspond to a circuit chip. Each memory cell may be a volatile memory cell or may be a nonvolatile memory cell. While it is described below that the semiconductor device 100 is a vertical NAND flash device, embodiments of the disclosure are not limited thereto.

The first chip C1 may include a plurality of row lines RL and a plurality of interlayer dielectric layers 20 which are alternately stacked on a first substrate 10. Among the row lines RL, at least one layer from the lowermost layer may be designated as a source select line SSL, and at least one layer from the uppermost layer may be designated as a drain select line DSL. The row lines RL between the source select line SSL and the drain select line DSL may be designated as word lines WL.

A plurality of vertical channels CH, which pass through the row lines RL and the interlayer dielectric layers 20, may be defined or disposed on the substrate 10. While not illustrated, each of the vertical channels CH may include a channel layer and a gate dielectric layer. The channel layer may include polysilicon or monocrystalline silicon, and may include a P-type impurity such as boron (B) in some regions. The gate dielectric layer may have the shape of a straw or a cylindrical shell which surrounds the outer wall of the channel layer. The gate dielectric layer may include a tunnel dielectric layer, a charge storage layer and a blocking layer which are sequentially stacked in an inward direction from the outer wall of the channel layer. In some embodiments, the gate dielectric layer may have an ONO (oxide-nitride-oxide) stack structure in which an oxide layer, a nitride layer and an oxide layer are sequentially stacked. Source select transistors may be configured in areas or regions where the source select line SSL surrounds the vertical channels CH. Memory cells may be configured in areas or regions where the word lines WL surround the vertical channels CH. Drain select transistors may be configured in areas or regions where the drain select line DSL surrounds the vertical channels CH.

Figure 2:
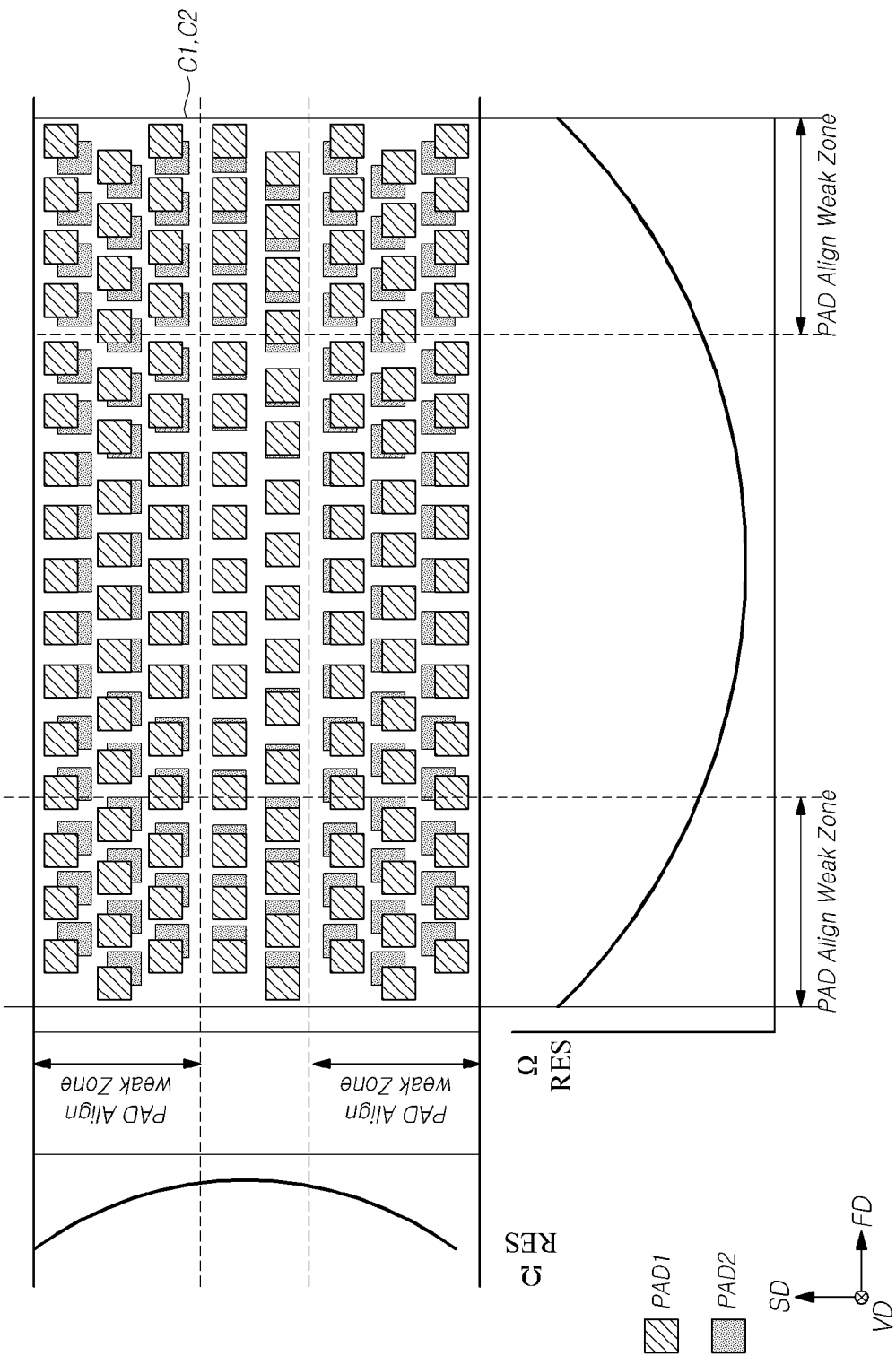
FIG. 2 is a diagram illustrating an example of alignment states between pads of a first chip and pads of a second chip and resultant pad contact resistances.

Bit lines BL may be located over the vertical channels CH. The bit lines BL may extend in a second direction SD that intersects with a first direction FD, and may be disposed in the first direction FD. The bit lines BL may be coupled to the vertical channels CH through bit line contacts BLC. The first chip C1 may include a plurality of first pads PAD1 on or common to one surface thereof that faces the second chip C2. Each of the bit lines BL may be coupled to a first pad PAD1 through a contact 30. Each of the row lines RL may be coupled to a first pad PAD1 through contacts 32 and 34 and a wiring line 36. FIG. 2 shows only first pads PAD1 connected to some row lines RL, it should be understood that first pads PAD1 are connected to all row lines RL, respectively.

The second chip C2 may include a row decoder 120 and a page buffer circuit 130, which are defined or disposed on a second substrate 12. FIG. 1 illustrates a case where the row lines RL and the bit lines BL of the first chip C1 are coupled to the row decoder 120 and the page buffer circuit 130 of the second chip C2. The second chip C2 may include a plurality of second pads PAD2, disposed or located on a surface of substrate 12 that faces first chip C1, and corresponding to the first pads PAD1. Each of the second pads PAD2 may be coupled to one of the row decoder 120 or the page buffer circuit 130 through contacts 40 and 42 and a wiring line 44.

The second chip C2 may be bonded onto the first chip C1 such that corresponding first pads PAD1 and second pads PAD2 may be coupled to each other. Upon chip bonding, a misalignment may occur between a first pad PAD1 and a second pad PAD2. In this case, an overlap area between the first pad PAD1 and the second pad PAD2 may decrease, and thereby a pad contact resistance may increase.

FIG. 2 is a diagram illustrating an example of alignment states between the first pads of the first chip and the second pads of the second chip and resultant pad contact resistances.

In FIG. 2, in a top view first chip C1 and the second chip C2 are relatively positioned such that a first pad PAD1 and a second pad PAD2 at or near the center of the device have little or no overlap upon chip bonding. In this example, no misalignment may occur between the first pad PAD1 and the second pad PAD2 at the center of the device, or the size of any misalignment may not be large even though the misalignment occurs, such the contact resistance between the aligned first pad PAD1 and second pad PAD2 may be small or inconsequential. On the other hand, in areas away from the center of the device, a large or larger misalignment may occur between a first pad PAD1 and a second pad PAD2, for example at an edge part distant from the center part. In such peripheral locations, the contact resistance between the first pad PAD1 and the second pad PAD2 may be large as a result of the misalignment.

During operation of the semiconductor device, operation voltages from the second chip C2 may be provided to the first chip C1 via the area of contact between the second pads PAD2 and the first pads PAD1. In a region where the size of a pad misalignment is small (e.g., at or near the center of the device), the contact resistance between a first pad PAD1 and a second pad PAD2 is small and thus the magnitude of a voltage dropped at the contact portion between the first pad PAD1 and the second pad PAD2 is not large or minimal. Thus, it is possible to provide an operation voltage of a desired level to the first chip C1 through this contact. On the other hand, in a region where the size of a pad misalignment is large (e.g., at or near the periphery of the device), since the magnitude of a voltage drop at the contact portion between a first pad PAD1 and a second pad PAD2 is larger, a resulting voltage of a level lower than desired may be provided to the first chip C1.

For instance, in a program operation, a program voltage from the second chip C2 may be provided to a row line of the first chip C1 via the contact portion between a second pad PAD2 and a first pad PAD1. In a region or area where the size of a pad misalignment is small, a program voltage of a desired level may be provided to a row line. On the other hand, in a PAD Align Weak Zone where the size of a pad misalignment is larger, a program voltage of a level lower than the desired level may be provided to a row line. Therefore, in a PAD Align Weak Zone where the size of a pad misalignment may be large, a rising level in the threshold voltage of a memory cell may decrease, and thereby, a slow cell with degraded cell distribution characteristic may result. That is to say, a slow failure may occur. On the other hand, in a region where the size of a pad misalignment is small or minimal, a slow failure might not occur.

In the program operation, a power supply voltage from the second chip C2 may be provided to a bit line of the first chip C1 via the contact portion between a second pad PAD2 and a first pad PAD1. In a read operation, a precharge voltage from the second chip C2 may be provided to a bit line of the first chip C1 via the contact portion between a second pad PAD2 and a first pad PAD1. In a region or area where the size of a pad misalignment is small, a power supply voltage and a precharge voltage of desired levels may be provided to bit lines. On the other hand, in a PAD Align Weak Zone where the size of a pad misalignment is larger, a power supply voltage and a precharge voltage of levels lower than the desired levels may be provided to bit lines. Therefore, the wrong data may be programmed or read in a region where the size of a pad misalignment is large, whereas program and read failures are reduces or may not occur in a region where the size of a pad misalignment is small.

As such, if the magnitude of an operation voltage provided to the first chip C1 varies, potential failures may occur depending on the positioning or misalignment of a pad, the reliability of the semiconductor device may deteriorate markedly. Embodiments of the disclosure propose a semiconductor device capable of compensating for a voltage drop due to a pad misalignment that varies depending on-chip location, thereby stabilizing a voltage delivered to the first chip C1 regardless of the position of a pad.

Figure 3:
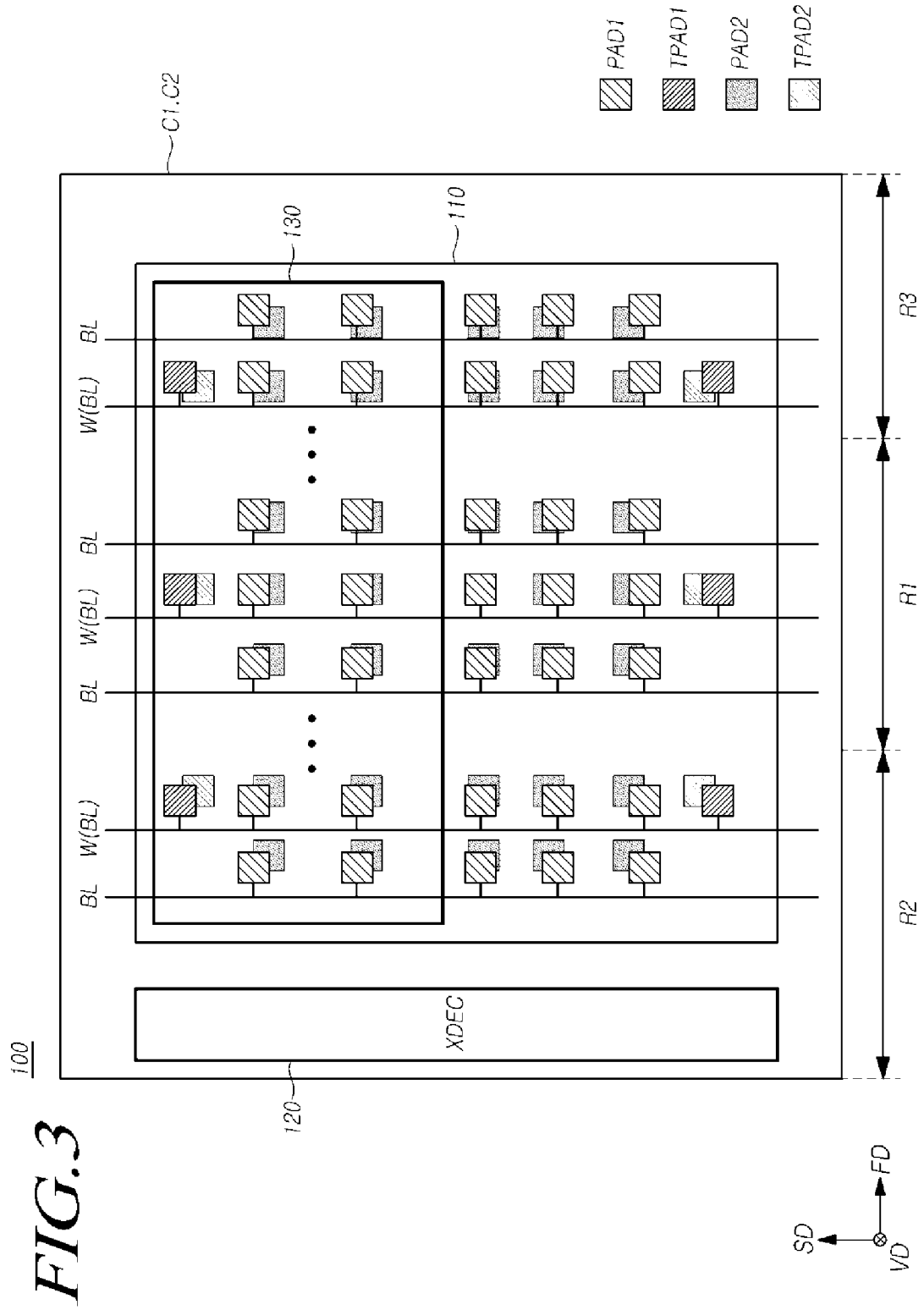
FIG. 3 is a top view schematically illustrating an example of a semiconductor device in accordance with an embodiment of the disclosure.
Figure 4:
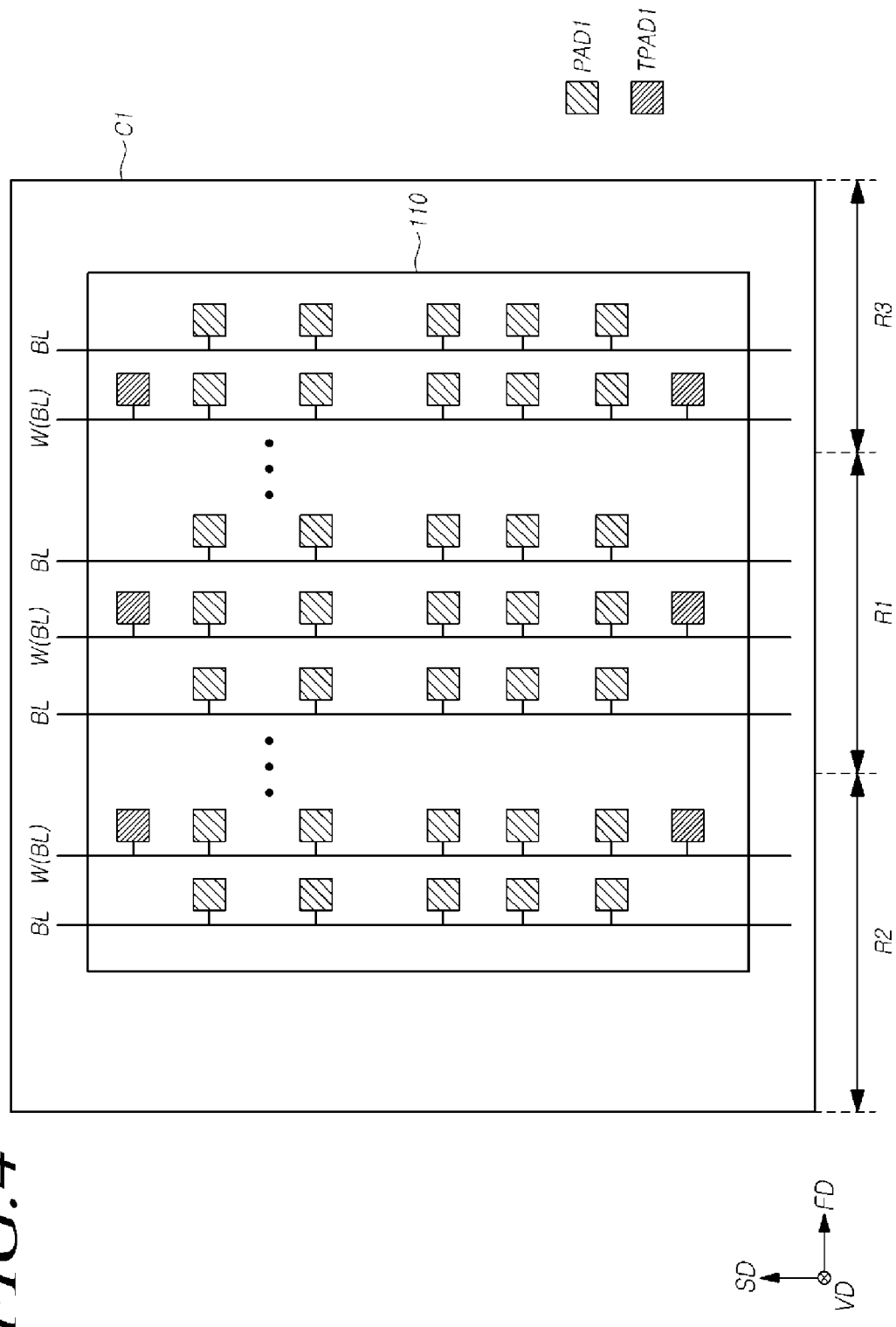
FIG. 4 is a top view schematically illustrating an example of a first chip of FIG. 3.
Figure 5:
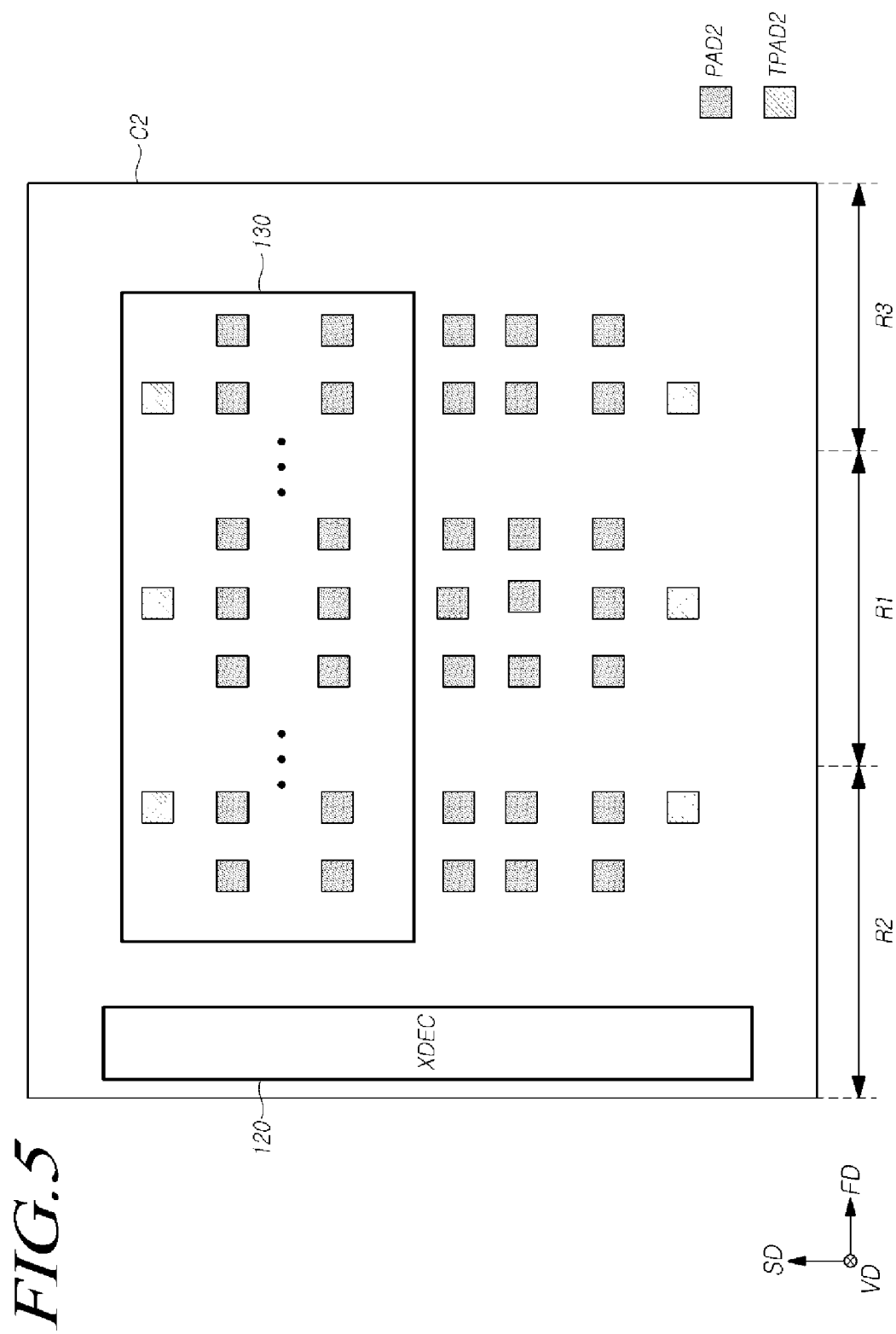
FIG. 5 is a top view schematically illustrating an example of a second chip of FIG. 3.
Figure 6:
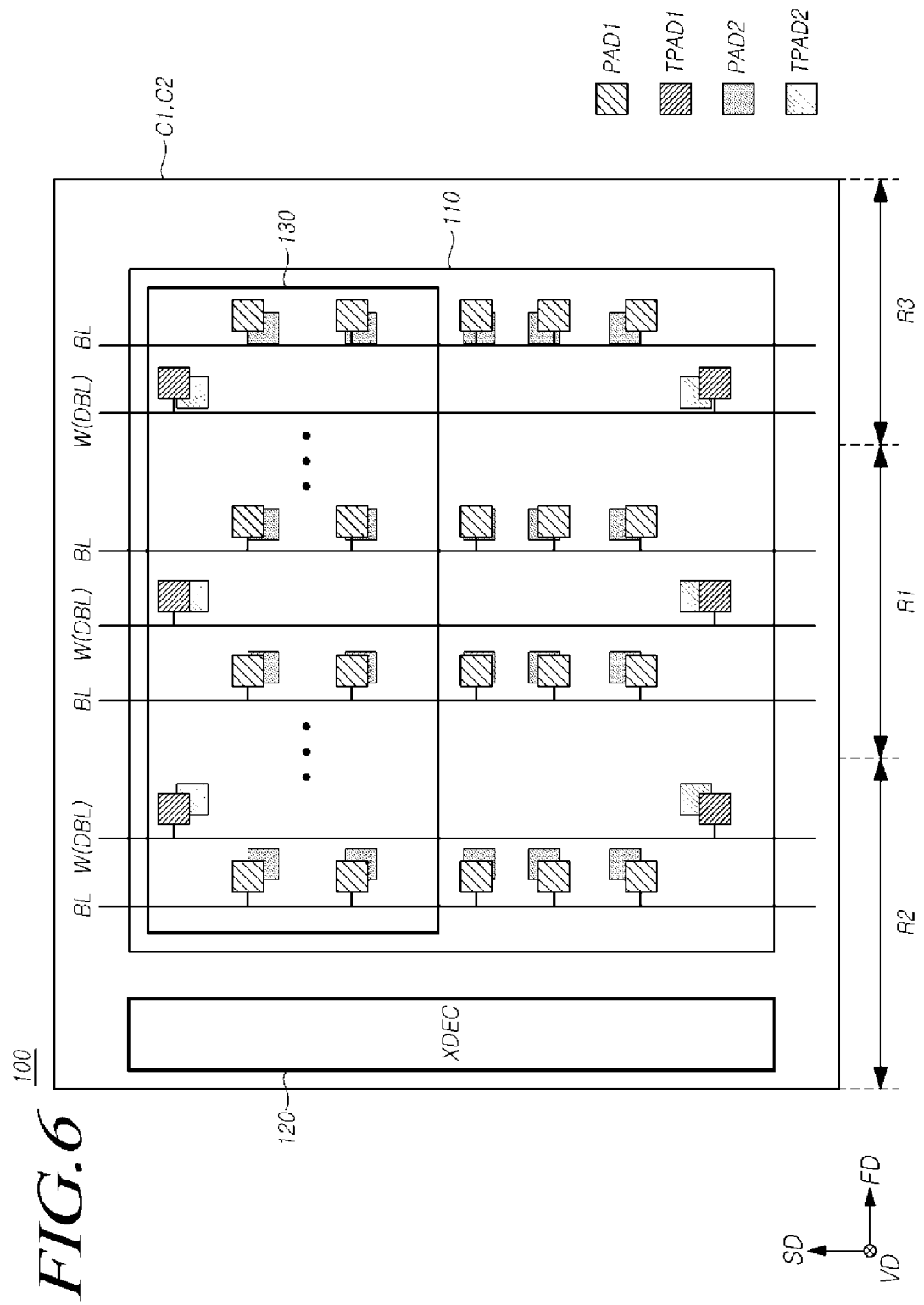
FIG. 6 is a top view schematically illustrating an example of a semiconductor device in accordance with an embodiment of the disclosure.

FIG. 3 is a top view schematically illustrating an example of a semiconductor device in accordance with an embodiment of the disclosure; FIG. 4 is a top view schematically illustrating an example of a first chip of FIG. 3; FIG. 5 is a top view schematically illustrating an example of a second chip of FIG. 3; and FIG. 6 is a top view schematically illustrating an example of a semiconductor device in accordance with an embodiment of the disclosure.

Referring to FIGS. 3 and 4, a first chip C1 of semiconductor device 100 may include a memory cell array 110. The memory cell array 110 may include a plurality of memory blocks (not illustrated) which are disposed in the second direction SD. While not illustrated, each of the memory blocks may include a plurality of cell strings. Each cell string may include at least one drain select transistor, a plurality of memory cells and at least one source select transistor which are coupled in series.

A plurality of first pads PAD1 may be defined or disposed on one surface of the first chip C1. The first pads PAD1 may be coupled to components included in the first chip C1, such as for example, row lines and bit lines. For the sake of simplicity in illustration, FIGS. 3 and 4 illustrate only the first pads PAD1 coupled to bit lines BL.

A semiconductor device 100 may be divided into a plurality of regions R1 to R3. In an embodiment, the plurality of regions R1 to R3 may include first to third regions R1 to R3 which are disposed in the first direction FD. The bit lines BL and the first pads PAD1 may be provided in plural numbers in each of the first to third regions R1 to R3.

First test pads TPAD1 may be defined or disposed on the one surface of the first chip C1. In each of the first to third regions R1 to R3, a pair of first test pads TPAD1 may be coupled to a wiring line W which extends in the second direction SD. In an embodiment, the wiring line W may be configured by a bit line BL. Although FIG. 3 illustrates a case where the wiring line W is configured by a bit line BL, it is to be noted that the disclosure is not limited thereto. For example, as illustrated in FIG. 6, the wiring line W may be configured by a dummy bit line DBL. The dummy bit line DBL may not be coupled with the memory cell array 110. The dummy bit line DBL, as a pattern which has no relevancy with the operation of the memory cell array 110, may be disposed in the same layer as the bit lines BL and may extend in the second direction SD that is the same as the extending direction of the bit lines BL.

While the drawings illustrate first test pads TPAD1 disposed at or near both edges of the first chip C1 in the second direction SD, embodiments contemplated by the disclosure are not limited thereto. For example, in other embodiments, one of the first test pads TPAD1 may be disposed at or near a center part of the first chip C1 in the second direction SD, and the other may be disposed at an edge part thereof.

Referring to FIGS. 3 and 5, a second chip C2 may include a plurality of logic circuits. The logic circuits may include a row decoder 120, a page buffer circuit 130, and a peripheral circuit (not illustrated).

The row decoder 120 may select one from among the memory blocks of the memory cell array 110 in response to a row address provided from the peripheral circuit. The row decoder 120 may transfer operation voltages provided from the peripheral circuit, to row lines coupled to the selected memory block.

The page buffer circuit 130 may include a plurality of page buffers which are coupled to the memory cell array 110 through the bit lines BL. The page buffers may receive a page buffer control signal from the peripheral circuit, and may transmit and receive data signals to and from the peripheral circuit. The page buffers may control the bit lines BL which are arranged in the memory cell array 110, in response to the page buffer control signal. For example, the page buffers may detect data stored in memory cells of the memory cell array 110, by sensing the signals of the bit lines BL of the memory cell array 110 in response to the page buffer control signal. The page buffers may transmit data signals to the peripheral circuit depending on the detected data. The page buffers may apply operation voltages to the bit lines BL based on data signals received from the peripheral circuit in response to the page buffer control signal, and thereby, may write data to the memory cells of the memory cell array 110. The page buffers may write data to or read data from memory cells, which are coupled to an activated word line.

The peripheral circuit may receive a command signal, an address signal and a control signal from the outside, and may transmit and receive data to and from an external device, for example, a memory controller. The peripheral circuit may output signals for writing data to the memory cell array 110 or reading data from the memory cell array 110, based on the command signal, the address signal and the control signal. The peripheral circuit may include a voltage generation circuit for generating various levels of operation voltages required in the semiconductor device, by using external power supplied from the outside. The voltage generation circuit may generate a reference voltage, and may generate the operation voltages by using the reference voltage.

In FIG. 5, a plurality of second pads PAD2 corresponding to the first pads PAD1 of the first chip C1 and a plurality of second test pads TPAD2 corresponding to the first test pads TPAD1 of the first chip C1 may be defined on one surface of the second chip C2. The second pads PAD2 may be coupled to the page buffer circuit 130. Although not illustrated, the page buffer circuit 130 may be coupled to the voltage generation circuit, and thereby, may transfer the operation voltages provided from the voltage generation circuit to the second pads PAD2. The second test pads TPAD2 may be coupled to the voltage generation circuit, and may configure feedback paths which will be described later.

FIG. 6 illustrates bonded first chip C1 and second chip C2 aligned with respect to at least one of the first pads PAD1 of the first region R1 and a second pad PAD2 corresponding thereto. Therefore, in the first region R1, no misalignment may occur between a first pad PAD1 and a second pad PAD2 or the size of a misalignment may be small even though a misalignment occurs. Furthermore, in the first region R1, no misalignment may occur between a first test pad TPAD1 and a second test pad TPAD2 or the size of a misalignment may be small even though the misalignment occurs. In the second and third regions R2 and R3, a misalignment of a large or significant size may occur between a first pad PAD1 and a second pad PAD2. Similarly, in the second and third regions R2 and R3, a misalignment of a large or significant size may occur between a first test pad TPAD1 and a second test pad TPAD2. If, in the different regions R1 through R3, the sizes of pad misalignments are different, then the contact areas and the contact resistances between first test pads TPAD1 and second test pads TPAD2 may become different, and thus, the values of voltages dropped at the contact portions between the first test pads TPAD1 and the second test pads TPAD2 may become different in the different regions. In order to monitor the value of a voltage dropped at the contact portion between a first test pad TPAD1 and a second test pad TPAD2, a feedback path may be defined in each of the first to third regions R1 to R3. The feedback path may include a wiring line W, a pair of first test pads TPAD1 coupled to the wiring line W and second test pads TPAD2 brought into contact with the first test pads TPAD1. The voltage generation circuit of the second chip C2 may be linked to the feedback paths of the first to third regions R1 to R3, and may generate a compensatory voltage for each region based on the value of a voltage drop measured in each of the feedback paths.

Figure 7:
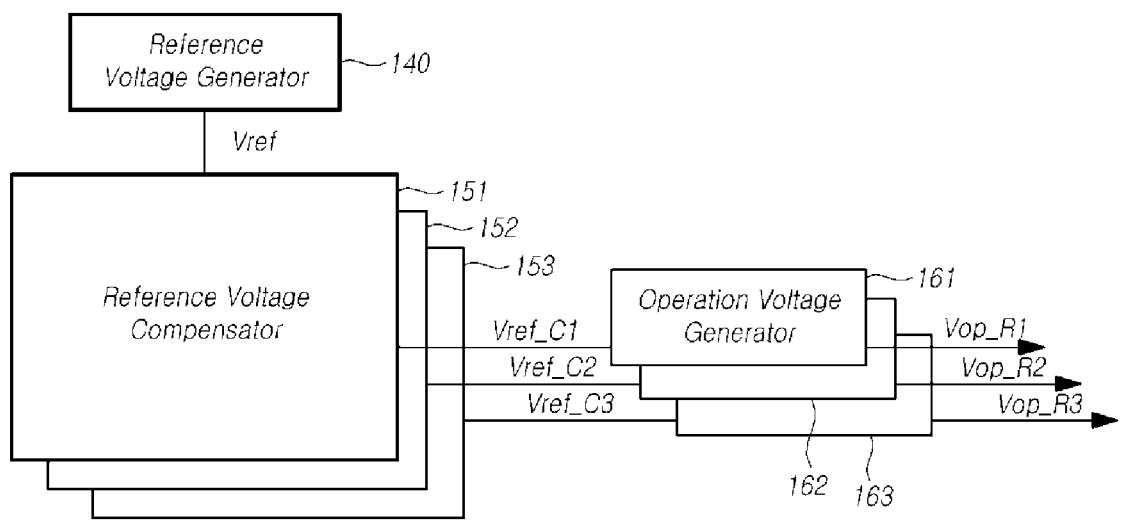
FIG. 7 is a block diagram illustrating an example of a voltage generation circuit of a semiconductor device in accordance with an embodiment of the disclosure.
Figure 8:
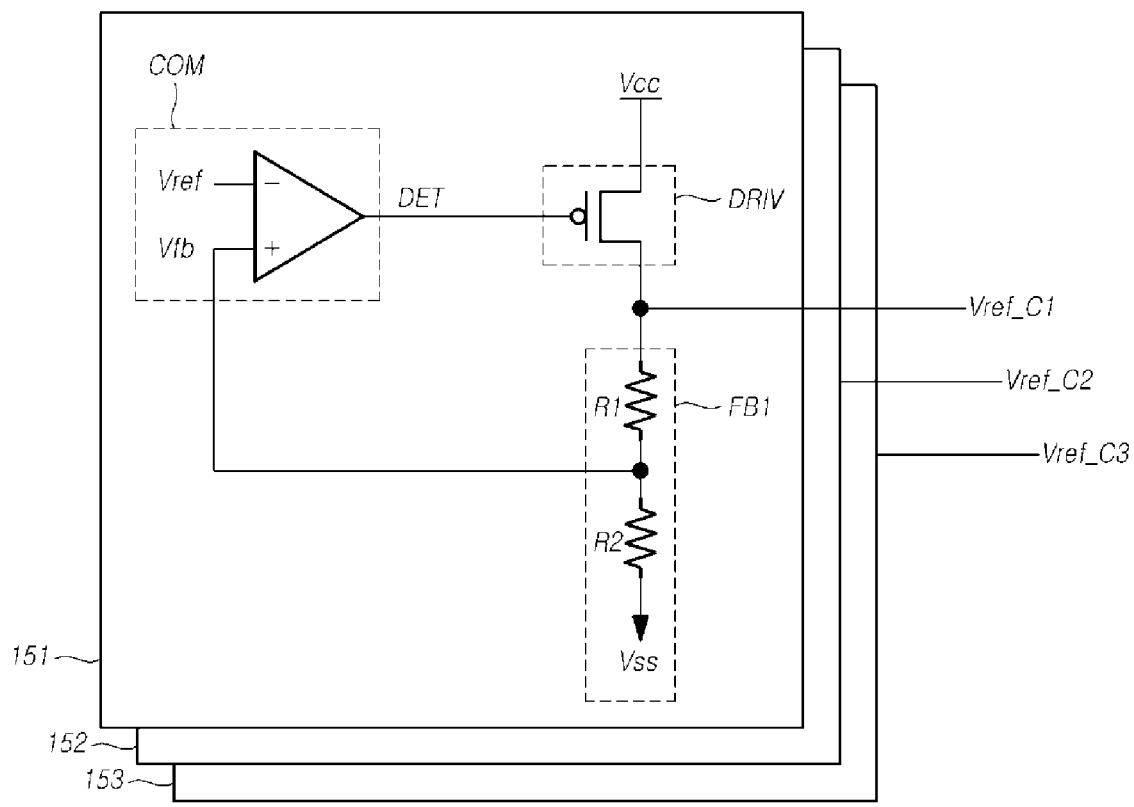
FIG. 8 is a circuit diagram illustrating an example of reference voltage compensators of FIG. 7.

FIG. 7 is a block diagram illustrating an example of a voltage generation circuit of a semiconductor device in accordance with an embodiment of the disclosure, and FIG. 8 is a circuit diagram illustrating an example of reference voltage compensators of FIG. 7.

Referring to FIG. 7, a voltage generation circuit may include a reference voltage generator 140, a plurality of reference voltage compensators 151 to 153, and a plurality of operation voltage generators 161 to 163.

The reference voltage generator 140 may generate a reference voltage Vref using an external power source. The reference voltage generator 140 may generate the reference voltage Vref of a constant level regardless of the magnitude of the external power.

Referring to FIGS. 3 and 7, first through third operation voltage generators 161 to 163 correspond to the first through third regions R1 to R3, respectively. The first operation voltage generator 161 may be linked to the second pads PAD2 defined in the first region R1, through the page buffer circuit 130. The first operation voltage generator 161 may generate a first operation voltage Vop_R1 based on a first compensated reference voltage Vref_C1, and may provide the first operation voltage Vop_R1 to the second pads PAD2 of the first region R1 through the page buffer circuit 130.

The second operation voltage generator 162 may be linked to the second pads PAD2 defined in the second region R2, through the page buffer circuit 130. The second operation voltage generator 162 may generate a second operation voltage Vop_R2 based on a second compensated reference voltage Vref_C2, and may provide the second operation voltage Vop_R2 to the second pads PAD2 of the second region R2 through the page buffer circuit 130. The third operation voltage generator 163 may be linked to the second pads PAD2 defined in the third region R3, through the page buffer circuit 130. The third operation voltage generator 163 may generate a third operation voltage Vop_R3 based on a third compensated reference voltage Vref_C3, and may provide the third operation voltage Vop_R3 to the second pads PAD2 of the third region R3 through the page buffer circuit 130.

The operation voltages Vop_R1 to Vop_R3 provided to the second pads PAD2 may be transferred to the first chip C1 via the contact portions between the second pads PAD2 and the first pads PAD1.

The first through third reference voltage compensators 151 through 153 correspond to the first through third regions R1 to R3, respectively. The first to third reference voltage compensators 151 to 153 may be provided with the reference voltage Vref from the reference voltage generator 140. The first reference voltage compensator 151 may generate a first compensated reference voltage Vref_C1 based on a voltage drop value due to the contact resistance between the first test pads TPAD1 and the second test pads TPAD2 defined in the first region R1 and based on the reference voltage Vref provided from the reference voltage generator 140.

The second reference voltage compensator 152 may generate a second compensated reference voltage Vref_C2 based on a voltage drop value due to the contact resistance between the first test pads TPAD1 and the second test pads TPAD2 defined in the second region R2 and based on the reference voltage Vref provided from the reference voltage generator 140. The third reference voltage compensator 153 may generate a third compensated reference voltage Vref_C3 based on a voltage drop value due to the contact resistance between the first test pads TPAD1 and the second test pads TPAD2 defined in the third region R3 and based on the reference voltage Vref provided from the reference voltage generator 140.

Referring to FIG. 8, the first reference voltage compensator 151 may include a comparator COM which compares the reference voltage Vref inputted through an inverting input terminal (−) and a feedback voltage Vfb inputted through a non-inverting input terminal (+), and a driver DRIV which receives, as a gate input, a driver control signal DET as an output signal of the comparator COM. Driver DRIV is coupled between a power supply voltage terminal Vcc and an output terminal, and thereby pull-up drives the first compensated reference voltage Vref_C1 being a signal of the output terminal, in response to the driver control signal DET. The output terminal of the driver DRIV may be coupled to the non-inverting input terminal (+) of the comparator COM through a feedback path FB1.

Referring to FIGS. 3 and 8, the feedback path FB1 may pass through the contact portion between the second test pad TPAD2 and the first test pad TPAD1 of the first region R1. The first compensated reference voltage Vref_C1, which is an output signal of the driver DRIV, may be dropped while passing through the feedback path FB1, and thus, the feedback voltage Vfb of a level lower than the first compensated reference voltage Vref_C1 may be provided to the non-inverting input terminal (+) of the comparator COM. The value of the voltage drop passed through the feedback path FB1 may vary depending on the size of a misalignment between the second test pad TPAD2 and the first test pad TPAD1 of the first region R1. A voltage value dropped on the feedback path FB1 may be relatively small if the size of a misalignment between the second test pad TPAD2 and the first test pad TPAD1 is not large. A voltage value dropped on the feedback path FB1 may be relatively large if the size of a misalignment between the second test pad TPAD2 and the first test pad TPAD1 is large or significant. The reference symbols R1 and R2 of FIG. 8 are resistance components that equalize the feedback path FB1, and the feedback voltage Vfb may be expressed by Equation 1 below.

$$Vfb = \frac{R1}{R1 + R2} \times Vref\_C1 \qquad \text{[Equation 1]}$$

The comparator COM compares the reference voltage Vref and the feedback voltage Vfb, and activates the driver control signal DET to a logic low level if the feedback voltage Vfb is lower than the reference voltage Vref. Due to this fact, a pull-up PMOS transistor which configures the driver DRIV is turned on, and thereby, pull-up drives the first compensated reference voltage Vref_C1. While the first compensated reference voltage Vref_C1 undergoes a recovery process, if the level of the feedback voltage Vfb reaches the level of the reference voltage Vref, then the driver control signal DET is changed to a logic high level. In response, the pull-up PMOS transistor that configures the driver DRIV is turned off, and thereby, prevents the first compensated reference voltage Vref_C1 from being further raised or increased.

The second reference voltage compensator 152 and the third reference voltage compensator 153 have substantially the same configuration as the first reference voltage compensator 151, except that feedback paths are disposed in not the first region R1 but the second region R2 and the third region R3, respectively.

Figure 9:
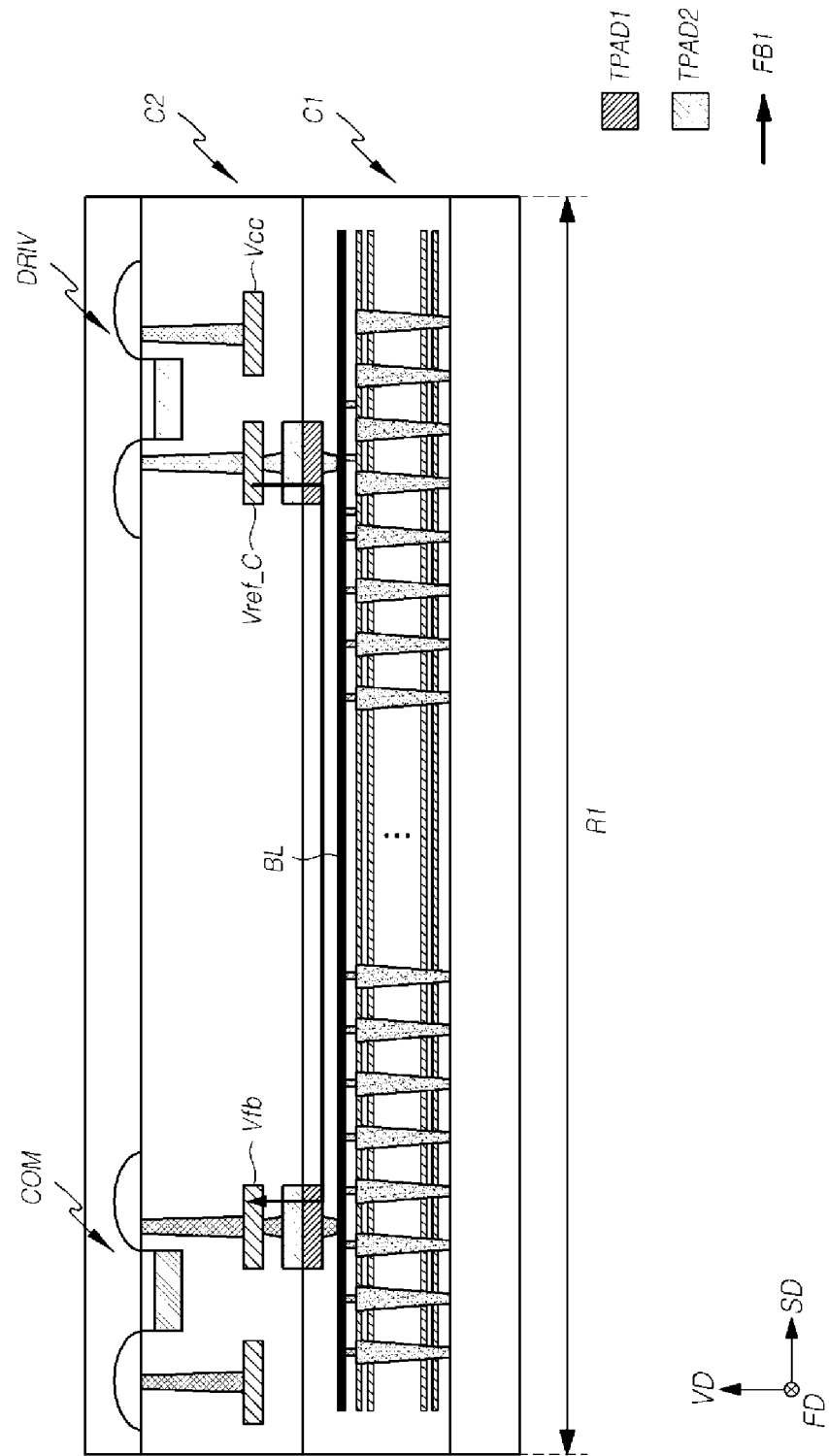
FIG. 9 is a cross-sectional view illustrating an example of a feedback path defined in a first region of FIG. 3.
Figure 10:
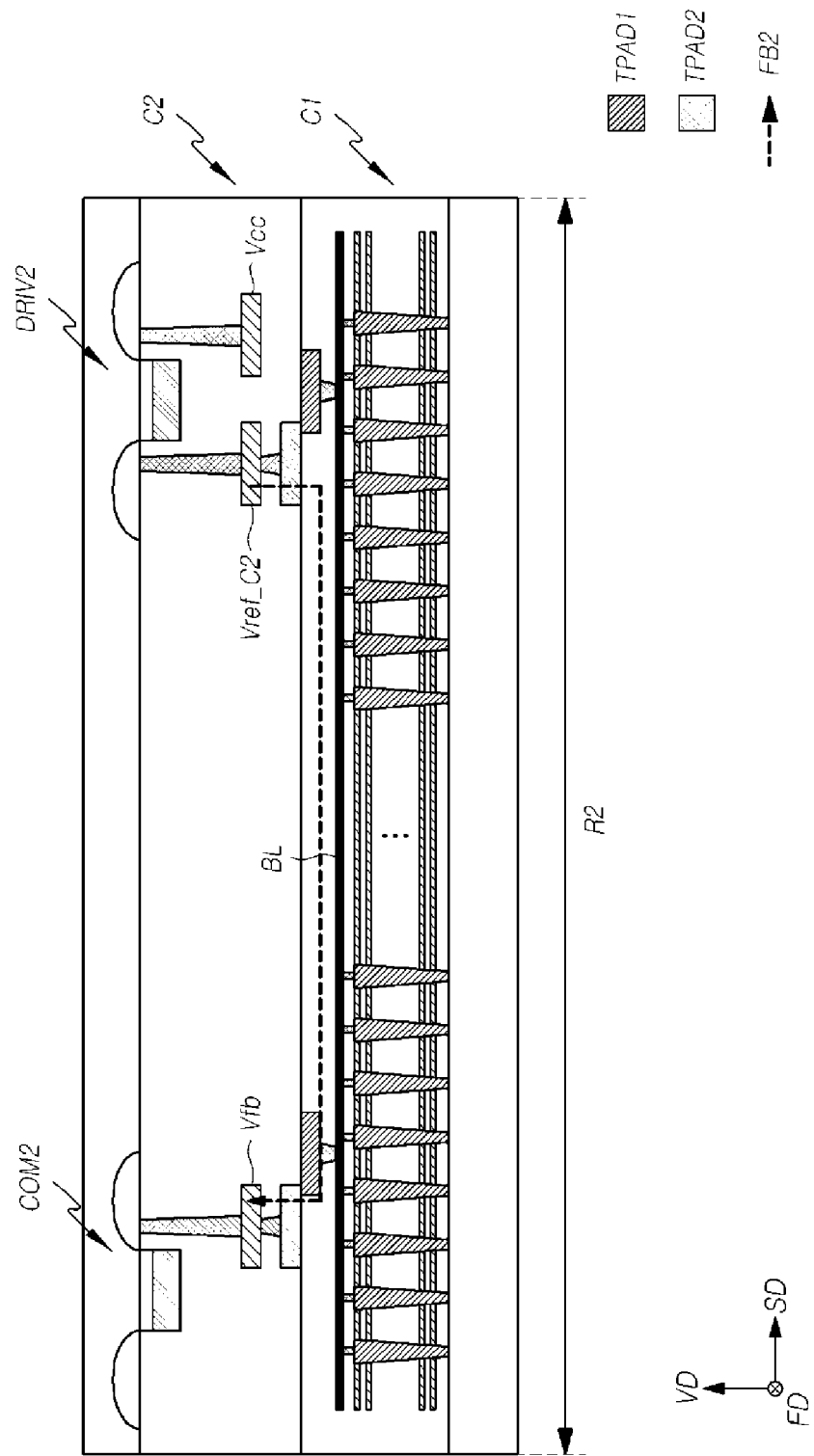
FIG. 10 is a cross-sectional view illustrating an example of a feedback path defined in a second region of FIG. 3.

FIG. 9 is a cross-sectional view illustrating an example of a feedback path defined in the first region of FIG. 3, and FIG. 10 is a cross-sectional view illustrating an example of a feedback path defined in the second region of FIG. 3.

Referring to FIG. 9, the feedback path FB1 defined in the first region R1 may include a pair of second test pads TPAD2 that are respectively coupled to the output terminal of the driver DRIV of the first reference voltage compensator 151 (see FIG. 8) and to the non-inverting input terminal of the comparator COM; first test pads TPAD1 bonded to the second test pads TPAD2; and a bit line BL which couples the first test pads TPAD1.

Referring to FIG. 10, a feedback path FB2 defined in the second region R2 may include a pair of second test pads TPAD2 that are respectively coupled to the output terminal of the driver DRIV of the second reference voltage compensator 152 (see FIG. 8) and to the non-inverting input terminal of the comparator COM; first test pads TPAD1 bonded to the second test pads TPAD2; and a bit line BL which couples the first test pads TPAD1. FIGS. 9 and 10 illustrate a wiring line, which couples first test pads TPAD1, is configured by a bit line. In other embodiments, the first test pads TPAD1 may be coupled using other wiring line instead of a bit line.

Referring to FIGS. 3 to 10, the size of a misalignment between the first test pads TPAD1 and the second test pads TPAD2 in the second region R2 may be larger than the size of a misalignment between the first test pads TPAD1 and the second test pads TPAD2 in the first region R1. In this case, the resistance of the feedback path FB2 of the second region R2 may be larger than the resistance of the feedback path FB1 of the first region R1. Therefore, the feedback voltage Vfb, inputted to the non-inverting input terminal (+) of the comparator COM of the second reference voltage compensator 152 via the feedback path FB2 of the second region R2, may be lower than the feedback voltage Vfb, inputted to the non-inverting input terminal (+) of the comparator COM of the first reference voltage compensator 151 via the feedback path FB1 of the first region R1. Accordingly, a voltage pulled up by the driver DRIV of the second reference voltage compensator 152 may be larger than a voltage pulled up by the driver DRIV of the first reference voltage compensator 151. In other words, the second compensated reference voltage Vref_C2 may have a value larger than the first compensated reference voltage Vref_C1.

As such, if the second compensated reference voltage Vref_C2 is larger than the first compensated reference voltage Vref_C1, then the second operation voltage Vop_R2 generated in the second operation voltage generator 162 may be larger than the operation voltage Vop_R1 generated in the first operation voltage generator 161. Therefore, even if the size of a misalignment between the first pad PAD1 and the second pad PAD2 in the second region R2 is larger than the size of a misalignment between the first pad PAD1 and the second pad PAD2 in the first region R1, operation voltages of substantially the same level may be provided to the first pad PAD1 of the first region R1 and the first pad PAD1 of the second region R2.

While embodiments described above and with reference to FIGS. 3 to 10 illustrate configurations for compensating for a bit line voltage, it is to be noted that the technical idea of the disclosure is not limited thereto. The disclosure may compensate for any operation voltage provided from the second chip C2 to the first chip C1. For example, an operation voltage (hereinafter, referred to as a 'row line voltage') provided to row lines of the first chip C1 may be compensated for. Hereinbelow, a structure for compensating for a row line voltage will be described with reference to FIGS. 11 to 15.

In compensating for a row line voltage, structural differences include, when compared to the structure described above with reference to FIGS. 3 to 10, a voltage generation circuit linked to the row decoder 120 instead of the page buffer circuit 130, and a wiring line configuring a feedback path extending in the first direction FD, which is also the direction the row lines RL extend. Thus, in the descriptions below, a structural configuration similar to that described above with reference to FIGS. 3 to 10 will be omitted, and descriptions will be mainly focused on the differences.

Figure 11:
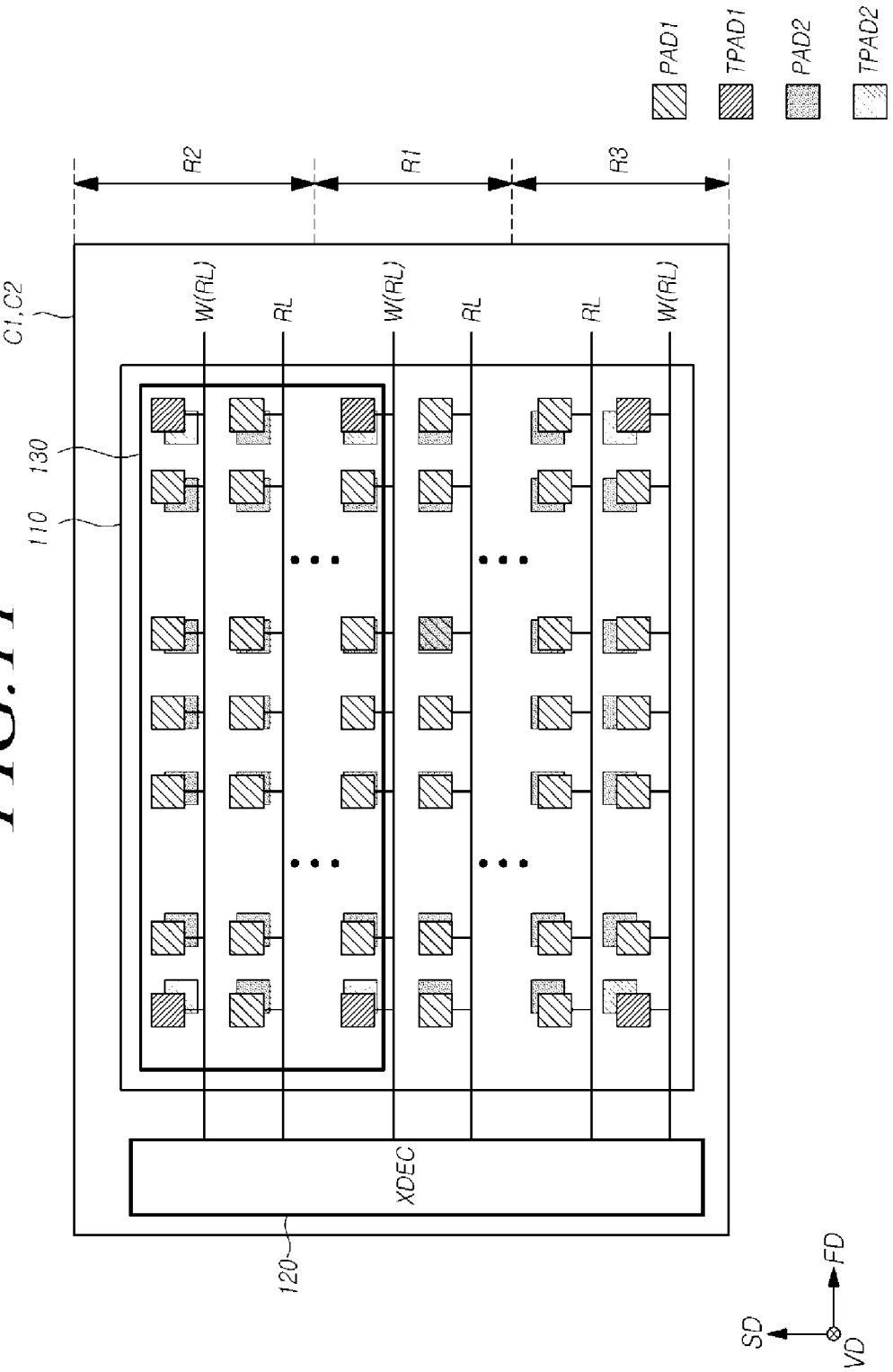
FIG. 11 is a top view schematically illustrating an example of a semiconductor device in accordance with an embodiment of the disclosure.
Figure 12:
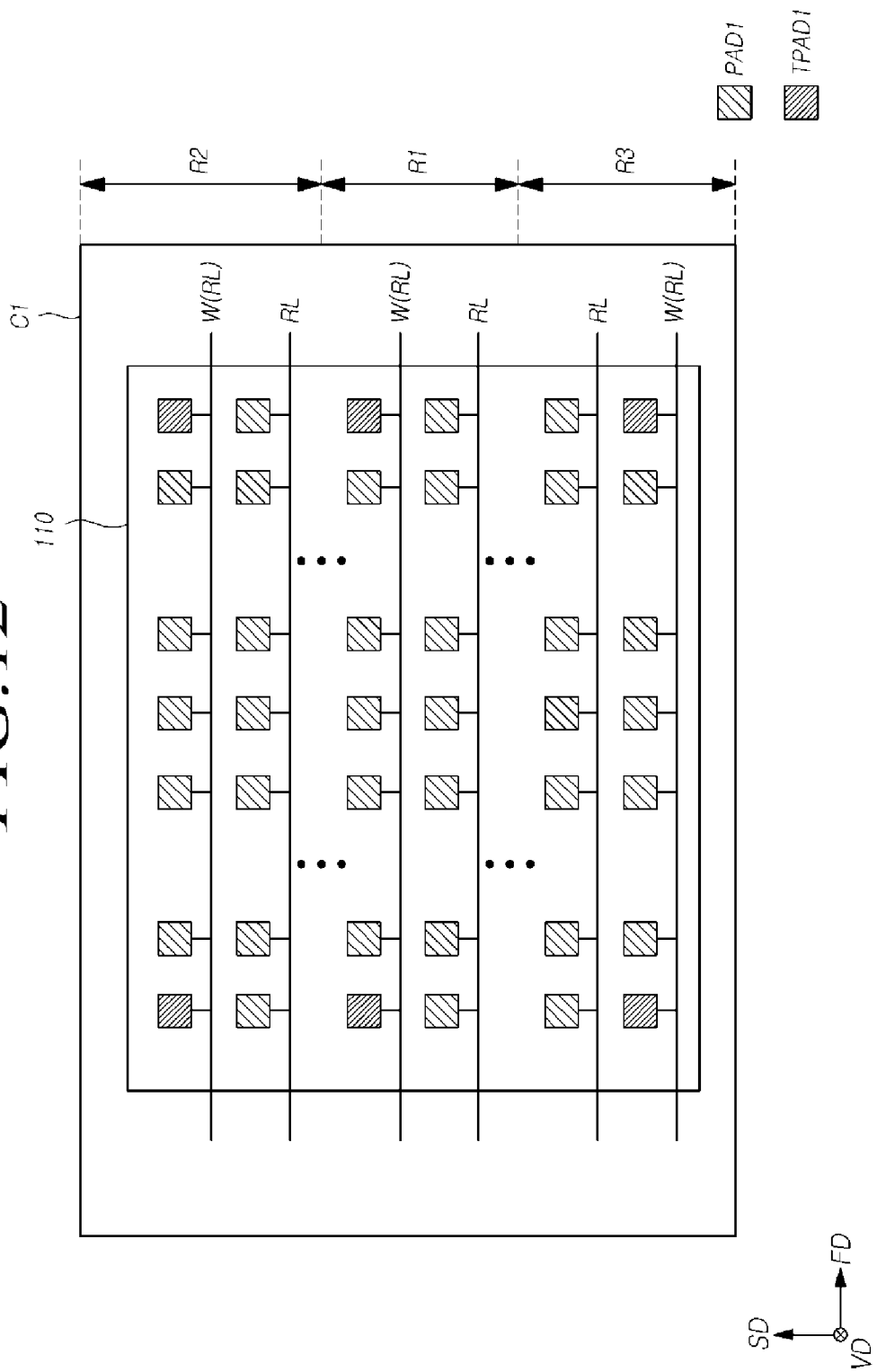
FIG. 12 is a top view schematically illustrating an example of a first chip of FIG. 11.

FIG. 11 is a top view schematically illustrating an example of a semiconductor device in accordance an embodiment of the disclosure. FIG. 12 is a top view schematically illustrating an example of a first chip of FIG. 11, and FIG. 13 is a top view schematically illustrating an example of a second chip of FIG. 11.

Referring to FIGS. 11 and 12, a semiconductor device may be divided into a plurality of regions R1 to R3. The regions R1 to R3 may include first to third regions R1 to R3 disposed in the second direction SD. A plurality of row lines RL and a plurality of first pads PAD1 coupled to the row lines RL may be disposed in each of the first to third regions R1 to R3.

First test pads TPAD1 may be defined or disposed on one surface of a first chip C1. In each of the first to third regions R1 to R3, a pair of first test pads TPAD1 may be coupled to a wiring line W, which extends in the first direction FD. In the present embodiment, the wiring line W may be configured by one of the row lines RL. Although FIGS. 11 through 13 illustrate a wiring line W configured by a row line RL, it is to be noted that the disclosure is not limited thereto.

Figure 13:
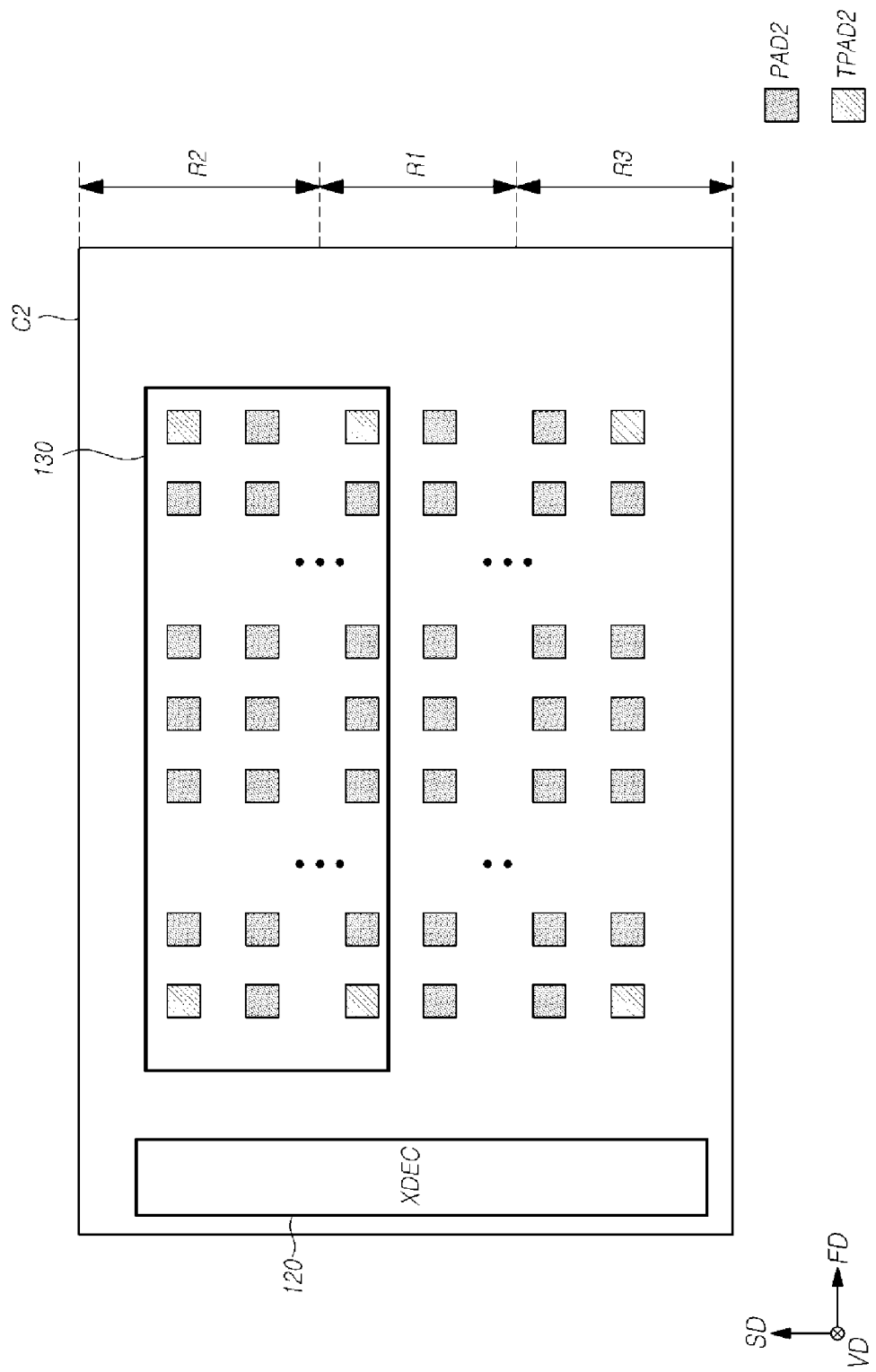
FIG. 13 is a top view schematically illustrating an example of a second chip of FIG. 11.

Referring to FIGS. 11 and 13, a plurality of second pads PAD2 corresponding to the first pads PAD1 of the first chip C1, and a plurality of second test pads TPAD2 corresponding to the first test pads TPAD1 of the first chip C1, may be defined or disposed on one surface of the second chip C2. The second pads PAD2 may be coupled to the row decoder 120. Although not illustrated, the row decoder 120 may be coupled to a voltage generation circuit, and thereby, may transfer the operation voltages provided from the voltage generation circuit, to the second pads PAD2. The second test pads TPAD2 may be coupled to the voltage generation circuit, and may configure feedback paths. The configuration of the voltage generation circuit is similar to that of the voltage generation circuit described above with reference to FIGS. 7 and 8, except that it generates a row line voltage by being linked to the row decoder 120 instead of the page buffer circuit 130.

Figure 14:
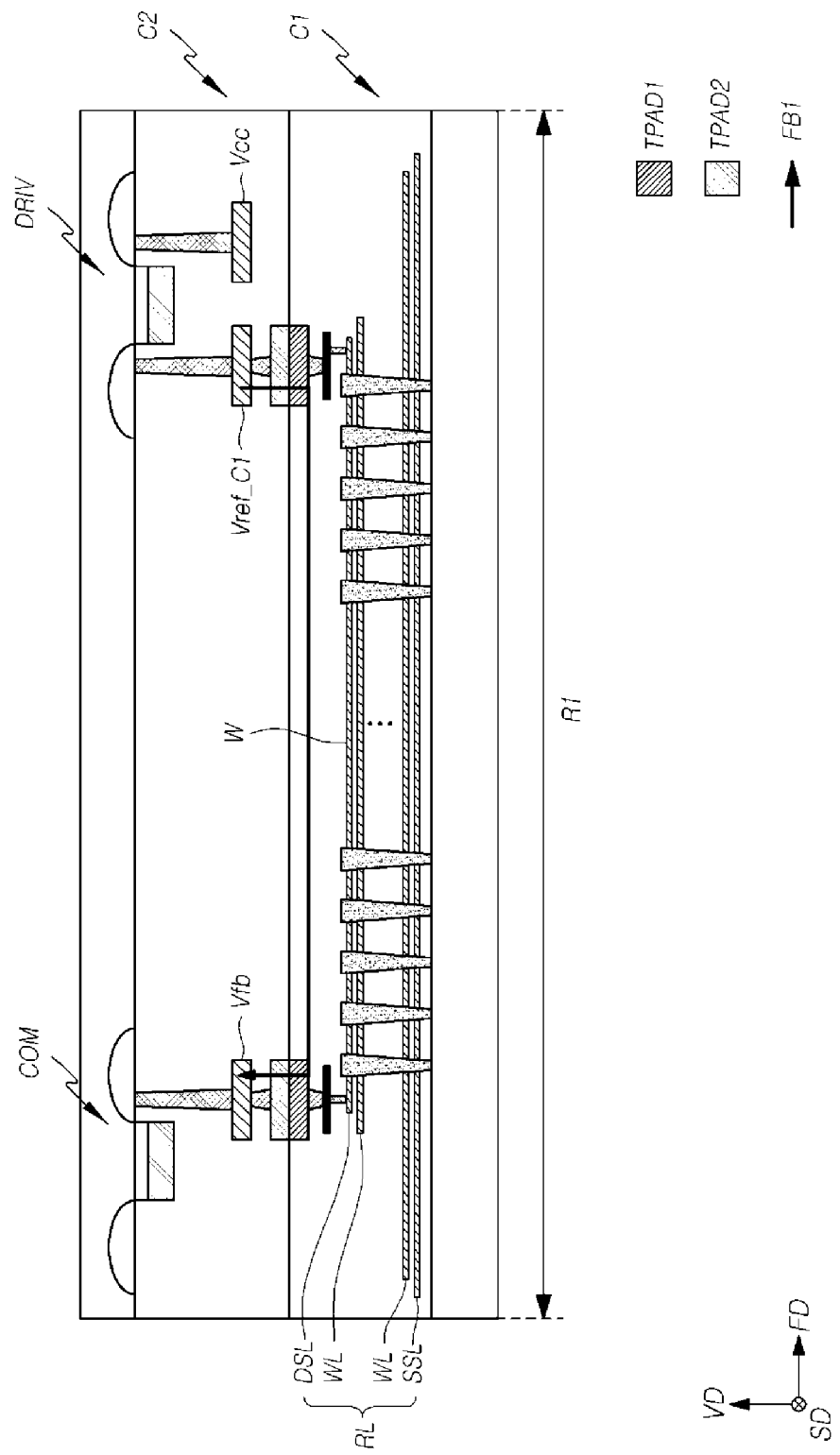
FIG. 14 is a cross-sectional view illustrating an example of a feedback path defined in a first region of FIG. 11.
Figure 15:
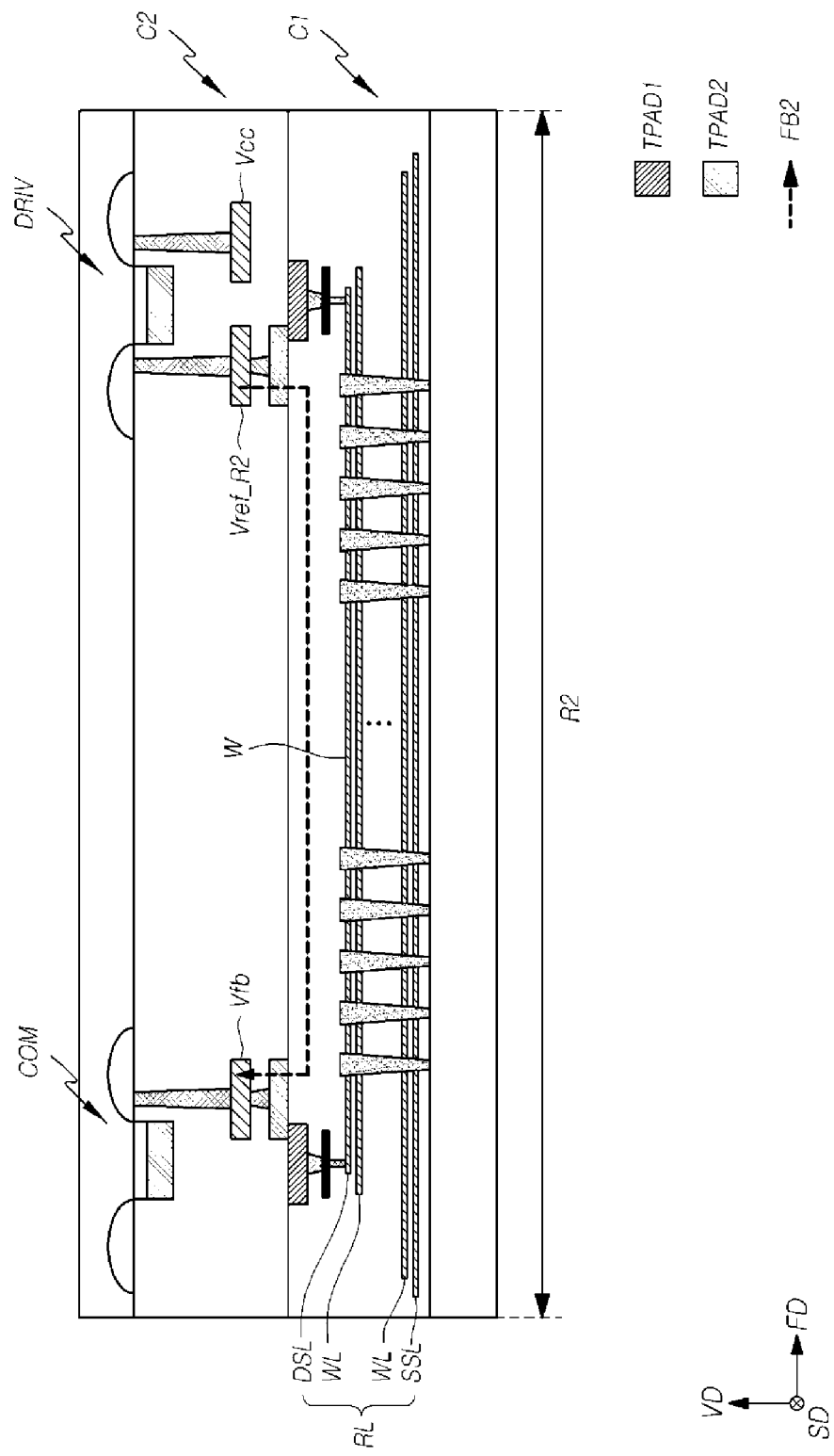
FIG. 15 is a cross-sectional view illustrating an example of a feedback path defined in a second region of FIG. 11.

FIG. 14 is a cross-sectional view illustrating a representation of an example of a feedback path defined in the first region R1 of FIG. 11, and FIG. 15 is a cross-sectional view illustrating a representation of an example of a feedback path defined in the second region R2 of FIG. 11.

Referring to FIG. 14, a feedback path FB1 may include a pair of second test pads TPAD2 respectively coupled to the output terminal of the driver DRIV of the first reference voltage compensator 151 (see FIG. 8) and to the non-inverting input terminal of the comparator COM; first test pads TPAD1 bonded to the second test pads TPAD2, and a wiring line W which extends in the first direction F1 and couples the first test pads TPAD1.

Referring to FIG. 15, a feedback path FB2 may include a pair of second test pads TPAD2 which are coupled respectively to the output terminal of the driver DRIV of the second reference voltage compensator 152 (see FIG. 8) and to the non-inverting input terminal of the comparator COM; first test pads TPAD1 bonded to the second test pads TPAD2; and a wiring line W that extends in the first direction F1 and couples the first test pads TPAD1.

The wiring lines W included in the feedback paths FB1 and FB2 may be configured by row lines disposed in the uppermost layer among the row lines RL. For instance, drain select lines DSL may be disposed in the uppermost layer among the row lines RL, and the wiring lines W may be configured by the drain select lines DSL.

As is apparent from the above descriptions, according to embodiments disclosed herein, it is possible to compensate for a voltage drop that occurs due to a difference in pad misalignment between regions in a process in which an operation voltage is transferred from the second chip C2 to the first chip C1. Consequently, it is possible to suppress variation in an operation voltage provided to the first chip C1 through different contacts in each region. It is possible to prevent an operation characteristic from varying depending on a region to be accessed, and to improve the reliability of a semiconductor device.

Figure 16:
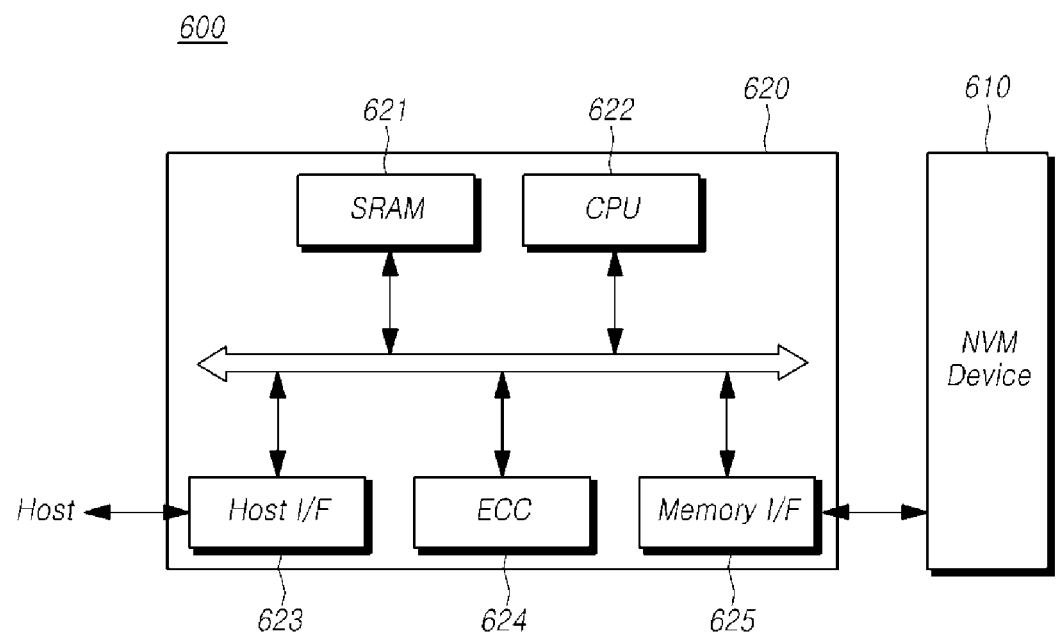
FIG. 16 is a block diagram schematically illustrating an example of a memory system including a semiconductor device in accordance with an embodiment of the disclosure.

FIG. 16 is a block diagram schematically illustrating an example of a memory system including a semiconductor device in accordance with an embodiment of the disclosure.

Referring to FIG. 16, a memory system 600 in accordance with an embodiment may include a nonvolatile memory device 610 and a memory controller 620.

The nonvolatile memory device 610 may be constituted by a semiconductor device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit 622. A host interface 623 includes a data exchange protocol of a host which is coupled with the memory system 600.

An error correction code block (ECC) 624 detects and corrects an error included in data read from the nonvolatile memory device 610.

A memory interface 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 17:
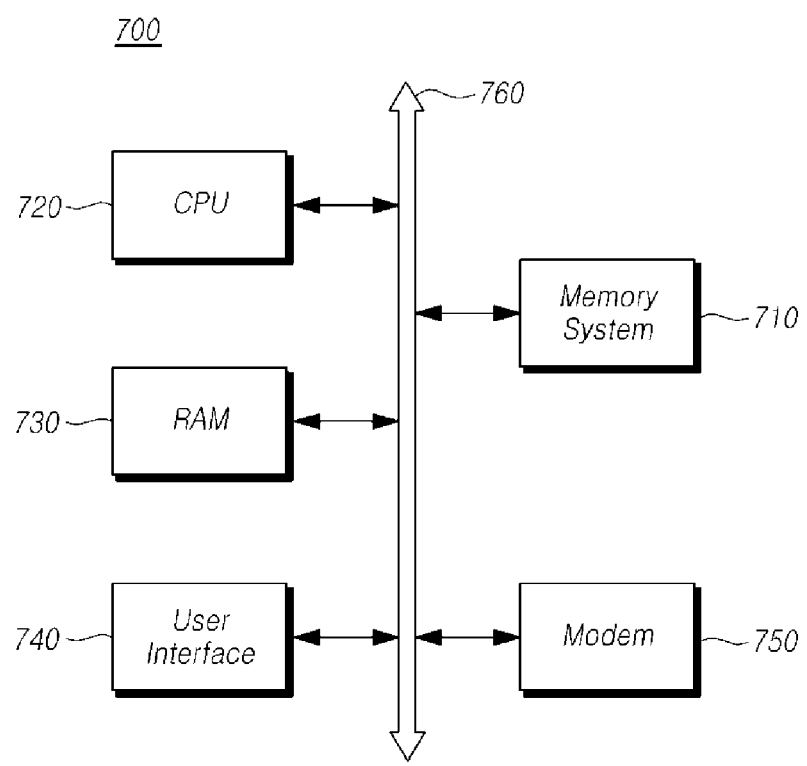
FIG. 17 is a block diagram schematically illustrating an example of a computing system including a semiconductor device in accordance with an embodiment of the disclosure.

FIG. 17 is a block diagram schematically illustrating an example of a computing system including a semiconductor device in accordance with an embodiment of the disclosure.

Referring to FIG. 17, a computing system 700 in accordance with an embodiment may include a memory system 710, a microprocessor 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor device comprising:
    a memory chip divided into a plurality of regions disposed in a first direction, each of the plurality of regions including a plurality of bit lines which extend in a second direction intersecting with the first direction and are coupled to a plurality of memory cells, a plurality of first pads which are coupled to the plurality of bit lines, and a plurality of first test pads coupled to each other through a wiring line extending in the second direction; and
    a circuit chip including a plurality of second pads corresponding to the plurality of first pads and a plurality of second test pads corresponding to the plurality of first test pads, and bonded onto the memory chip such that the plurality of second pads are coupled to the plurality of first pads,
    wherein the circuit chip includes a voltage generation circuit linked to the plurality of second pads and provides a compensated bit line voltage to the plurality of second pads for each of the plurality of regions, based on a voltage drop value for each region due to a contact resistance between the plurality of first test pads and the plurality of second test pads.

2. The semiconductor device according to claim 1, wherein the voltage generation circuit comprises:
    a plurality of reference voltage compensators corresponding respectively to the plurality of regions, and each configured to generate a compensated reference voltage for each of the plurality of regions, based a voltage value dropped on a feedback path passing through contact portions between the plurality of first test pads and the plurality of second test pads disposed in each corresponding region; and
    a plurality of operation voltage generators respectively corresponding to the plurality of regions, each configured to generate a bit line voltage to be provided to the plurality of second pads for each region, based on the compensated reference voltage.

3. The semiconductor device according to claim 2, wherein each of the plurality of reference voltage compensators comprises:
    a comparator configured to compare a reference voltage inputted to an inverting input terminal and a feedback voltage inputted to a non-inverting input terminal; and
    a driver configured to pull-up drive the compensated reference voltage, which is a signal of an output terminal, in response to an output signal of the comparator,
    wherein the non-inverting input terminal of the comparator is coupled to the output terminal of the driver through the feedback path.

4. The semiconductor device according to claim 1, wherein the wiring line comprises one of the plurality of bit lines.

5. The semiconductor device according to claim 1, wherein the wiring line comprises a dummy bit line which is not coupled to the plurality of memory cells.

6. A semiconductor device comprising:
a memory chip divided into a plurality of regions disposed in a second direction intersecting with a first direction, and including, in each of the plurality of regions, a plurality of row lines which extend in the first direction and are coupled to a plurality of memory cells, a plurality of first pads which are coupled to the plurality of row lines, and a plurality of first test pads coupled to each other through a wiring line extending in the first direction; and
a circuit chip including a plurality of second pads corresponding to the plurality of first pads and a plurality of second test pads corresponding to the plurality of first test pads, and bonded onto the memory chip such that the plurality of second pads are coupled to the plurality of first pads,
wherein the circuit chip includes a voltage generation circuit linked to the second pads and provides a compensated row line voltage to the plurality of second pads for each of the plurality of regions, based on a voltage drop value for each region due to a contact resistance between the plurality of first test pads and the plurality of second test pads.

7. The semiconductor device according to claim 6, wherein the voltage generation circuit comprises:
a plurality of reference voltage compensators corresponding to the plurality of regions, respectively, and each configured to generate a compensated reference voltage for each region, based on a voltage value dropped on a feedback path passing through contact portions between the plurality of first test pads and the plurality of second test pads disposed in each corresponding region; and
a plurality of operation voltage generators corresponding respectively to the plurality of regions, and each configured to generate a row line voltage provided to the plurality of second pads for each region, based on the compensated reference voltage.

8. The semiconductor device according to claim 7, wherein each of the reference voltage compensators comprises:
a comparator configured to compare a reference voltage inputted to an inverting input terminal and a feedback voltage inputted to a non-inverting input terminal; and
a driver configured to pull-up drive the compensated reference voltage that is a signal of an output terminal, in response to an output signal of the comparator,
wherein the non-inverting input terminal of the comparator is coupled to the output terminal of the driver through the feedback path.

9. The semiconductor device according to claim 6, wherein the wiring line comprises one of the plurality of row lines.

10. The semiconductor device according to claim 6,
wherein the plurality of row lines are stacked in a vertical direction perpendicular to the first direction and the second direction, and
wherein the wiring line is configured by an uppermost row line from among the row lines.

* * * * *